United States Patent
Ichimura et al.

(10) Patent No.: US 7,767,381 B2
(45) Date of Patent: Aug. 3, 2010

(54) PHOTOSENSITIVE RESIN COMPOSITION, AND PHOTOSENSITIVE FILM AND STENCIL FOR SCREEN PRINTING USING THE PHOTOSENSITIVE COMPOSITION

(75) Inventors: Kunihiro Ichimura, Yokohama (JP); Junichi Kawanobe, Chiba (JP); Chieko Hotta, Funabashi (JP); Eri Nagabuchi, Yachiyo (JP)

(73) Assignee: Murakami Co., Ltd., Tokyo-To (JP)

( * ) Notice: Subject to any disclaimer, the term of this patent is extended or adjusted under 35 U.S.C. 154(b) by 79 days.

(21) Appl. No.: 12/300,702

(22) PCT Filed: May 17, 2006

(86) PCT No.: PCT/JP2006/309847
§ 371 (c)(1),
(2), (4) Date: Nov. 13, 2008

(87) PCT Pub. No.: WO2007/132532
PCT Pub. Date: Nov. 22, 2007

(65) Prior Publication Data
US 2009/0099275 A1    Apr. 16, 2009

(51) Int. Cl.
G03C 1/00 (2006.01)
G03F 7/00 (2006.01)

(52) U.S. Cl. ............ 430/281.1; 430/270.1; 522/13; 522/83; 522/84; 522/85; 522/121; 522/120; 522/117; 522/116

(58) Field of Classification Search .......... 430/270.1, 430/281.1; 522/13, 83, 84, 85, 116, 117, 522/120, 121
See application file for complete search history.

(56) References Cited

U.S. PATENT DOCUMENTS

| | | | |
|---|---|---|---|
| 4,564,580 A | 1/1986 | Ichimura et al. | |
| 5,061,603 A * | 10/1991 | Hamilton et al. | 430/287.1 |
| 5,206,113 A * | 4/1993 | Mueller-Hess et al. | 430/270.1 |
| 5,332,651 A | 7/1994 | Dickinson et al. | |
| 5,866,296 A * | 2/1999 | Shibuya et al. | 430/195 |
| 6,808,865 B1 * | 10/2004 | Morigaki et al. | 430/280.1 |

FOREIGN PATENT DOCUMENTS

| | | | |
|---|---|---|---|
| JP | 49121852 A | 11/1974 | |
| JP | 50108003 A | 8/1975 | |
| JP | 55023941 A | 2/1980 | |
| JP | 55062446 A | 5/1980 | |
| JP | 55062905 A | 5/1980 | |
| JP | 59102232 A | 6/1984 | |
| JP | 59107343 A | 6/1984 | |
| JP | 6010244 A | 1/1985 | |
| JP | 60010243 A | 1/1985 | |
| JP | 60010245 A | 1/1985 | |
| JP | 60247637 A | 12/1985 | |
| JP | 01229005 A | 9/1989 | |
| JP | 05127377 A | 5/1993 | |
| JP | 06230568 A | 8/1994 | |
| JP | 09319080 A | 12/1997 | |

OTHER PUBLICATIONS

Yamaoka et al.; "Photopolymer Technology"; Nikkan Kogyo Shinbun, Ltd.; 1988. English-language Translation Attached.

* cited by examiner

*Primary Examiner*—Susan W Berman
(74) *Attorney, Agent, or Firm*—The Webb Law Firm

(57) ABSTRACT

This invention relates to a photosensitive composition characterized by comprising components A, B and C, and a photosensitive film and a stencil for screen printing using the photosensitive composition; Component A: a poly(vinyl alcohol) polymer represented by formula (1) or (2)

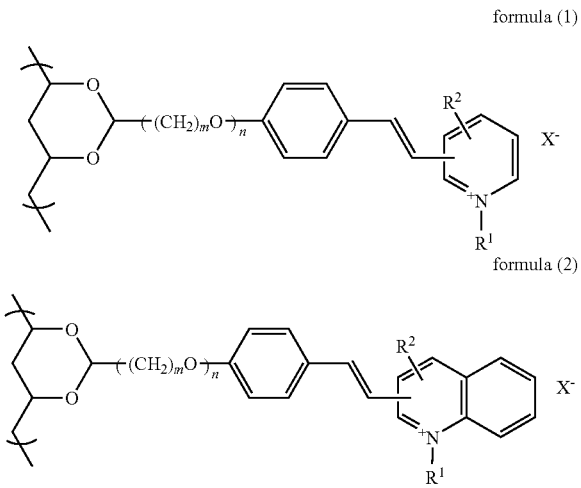

wherein $R^1$ represents a hydrogen atom, an alkyl or aralkyl group having 1 to 10 carbon atoms, wherein the alkyl and aralkyl groups may be substituted by a hydroxyl or carbamoyl group and the bond between carbon atoms thereof may be present through an oxygen atom or an unsaturated bond; $R^2$ represents a hydrogen atom or an alkyl group having 1 to 3 carbon atoms; m is an integer of 1 to 6; n is 0 or 1; and $X^-$ represents a halogen ion, a phosphate ion, a methosulfate ion, or a sulfonate ion, or a mixture of the anions; component B: a radical polymerizable monomer containing at least one ethylenically unsaturated bond and possesses an anion dissociating capability; and component C: a radical photoinitiator.

15 Claims, No Drawings

PHOTOSENSITIVE RESIN COMPOSITION, AND PHOTOSENSITIVE FILM AND STENCIL FOR SCREEN PRINTING USING THE PHOTOSENSITIVE COMPOSITION

TECHNICAL FIELD

This invention relates to a photosensitive resin composition, and a photosensitive film and a stencil for screen printing using the photosensitive resin composition. More particularly, the present invention relates to a photosensitive resin composition, which can be developed with water, possesses satisfactory water resistance, and possesses excellent long-term storage stability, and a photosensitive film and a stencil for screen printing using the photosensitive resin composition.

BACKGROUND ART

Photosensitive resin compositions have been put to practical use as materials for pattern formation in large quantity and in many fields (see "Photopolymer Technology", ed. Tsuguo Yamaoka and Gentaro Matunaga, published by THE NIKKAN KOGYO SHIMBUN, LTD., (1988)). Polymeric photosensitive materials possess excellent resolution and, at the same time, can realize setting of a broad exposure range, for example, by selecting a light wavelength and, thus, can be properly utilized according to applications. Further, the resin layer patterned by light irradiation plays an important role as a resist material in chemically, physically or dynamically etching the base material. The photosensitive resin composition has also been put to practical use as printing plate materials for relief plates, intaglio plates, lithographic plates, and stencil printing plates wherein a light pattern is transferred by ink.

By taking advantage of the above features, the photosensitive resin composition has been used as photoengraving materials in a wide range from submicrons to centimeters.

In general, in the case of polymeric photosensitive materials, a pattern is formed by development treatment based on a change in physical properties such as solubility which is based on a change in chemical structure between exposed parts and unexposed parts. Alternatively, when the photosensitive resin composition is used as a surface covering treatment material, the function of protecting the base material is developed by a change in physical properties based on a significant change in chemical structure upon exposure. The change in chemical structure in the above resin is based on a mere photochemical reaction, as well as on the whole of a variety of secondary chemical reactions induced by the photochemical reaction. As a result, for example, the solubility of the resin layer in a solvent before and after exposure can be arbitrarily selected.

When a relief pattern is formed from a photosensitive resin by development with a solvent, the use of water, which is most inexpensive and safe, as a solvent is indispensable because of direct relation to environmental problems such as working environments and measures against wastes. In order to use the water-developable photosensitive resin, for example, as a screen printing plate material, the resultant pattern should be resistant to solvents and water derived from ink. In particular, a pattern formed by development with water is in many cases hydrophilic, and, thus, photosensitive resins, which exhibits significantly improved water resistance, have been desired.

The use of a photosensitive resin composition comprising a photoradical polymerizable aqueous emulsion and a photocrosslinking agent has been extensively adopted as a method for improving water resistance. Examples of such photosensitive resin compositions include compositions comprising a photoradical polymerizable compound and an aqueous resin emulsion dispersed in poly(vinyl alcohol) (patent document 1: Japanese Patent Laid-Open No. 230568/1994), and water developable compositions produced by emulsifying an ethylenically unsaturated compound and a radical photoinitiator in poly(vinyl alcohol) and incorporating a photocrosslinking agent in the emulsion (for example, patent document 2: Japanese Patent Laid-Open No. 121852/1974, patent document 3: Japanese Patent Laid-Open No. 108003/1975; patent document 4: Japanese patent Laid-Open No. 107343/1984, and patent document 5: Japanese patent Laid-Open No. 127377/1993). In this case, even when a photoradical polymerization reaction proceeds, any crosslinked structure is not formed in the poly(vinyl alcohol) per se. Accordingly, photocrosslinking agents such as bichromates and diazo resins are added. The bichromate-type photosensitive resin, however, contains heavy metal ions, which cause environmental contamination, and has poor storage stability. For this reason, a two-component type should be adopted, and the utilization of the bichromate-type photosensitive resin is limited and is excluded. On the other hand, the use of a water-soluble diazo resin as a photocrosslinking agent poses problems that the photosensitization speed is low, and, due to the limitation of light transmission by coloring of the exposed parts, the water-soluble diazo resin is unsuitable for a thick photosensitive layer. In addition, the long-term storage stability is so poor that a two-component type, in which a photosensitive resin composition is prepared immediately before use, should be adopted. That is, in all the cases, inconvenience of two-component type is not eliminated.

Poly(vinyl alcohols) substituted by a photocrosslinkable residue typified by strylpyridinium have been proposed as one-component-type water-developable photosensitive resins (patent document 6: Japanese Patent Laid-Open No. 23941/1980 and patent document 7: Japanese Patent Laid-Open No. 62905/1980). Further, compositions comprising the photocrosslinkable poly(vinyl alcohol) and an aqueous emulsion have been proposed for screen printing plate making (patent document 8: Japanese Patent Laid-Open No. 62446/1980 and patent document 9: Japanese Patent Laid-Open No. 102232/1984). Since, however, the photocrosslinkable residue is hydrophilic, the water resistance of the relief pattern is unsatisfactory. To overcome this problem, the following proposals have been made. One of them is a composition containing a photoradical polymerizable emulsion added thereto (patent document 10: Japanese Patent Laid-Open No. 10243/1985, patent document 11: Japanese Patent Laid-Open No. 10244/1985, and patent document 12: Japanese Patent Laid-Open No. 247637/1985). Further, a method, in which dichromic acid or a diazo resin as a water soluble photocrosslinking agent is added to this type of composition, has also been proposed (Japanese Patent Laid-Open No. 10245/1985). Furthermore, the addition of phosphoric acid or a phosphorous acid compound has been proposed for improving the water resistance (patent document 13: Japanese Patent Laid-Open No. 229005/1989). Furthermore, a water-developable photosensitive resin composition comprising a water-soluble photoacid generator added to poly(vinyl alcohol) and an acid-reactive crosslinking agent has also been proposed (patent document 14: Japanese Patent Laid-Open No. 319080/1997).

So far as the present inventors know, however, the crosslinked poly(vinyl alcohol) has unsatisfactory water resistance from the viewpoint of maintaining the hydrophilicity. Accordingly, when screen printing is carried out using an aqueous ink, stencils produced using this composition cannot yet simultaneously realize satisfactory solvent resistance and water resistance. Further, problems involved in one-component-type photosensitive resin compositions, which satisfy various properties including mechanical strength, remain unsolved.

Patent document 1: Japanese Patent Laid-Open No. 230568/1994

Patent document 2: Japanese Patent Laid-Open No. 121852/1974

Patent document 3: Japanese Patent Laid-Open No. 108003/1975

Patent document 4: Japanese Patent Laid-Open No. 107343/1984

Patent document 5: Japanese Patent Laid-Open No. 127377/1993

Patent document 6: Japanese Patent Laid-Open No. 23941/1980

Patent document 7: Japanese Patent Laid-Open No. 62905/1980

Patent document 8: Japanese Patent Laid-Open No. 62446/1980

Patent document 9: Japanese Patent Laid-Open No. 102232/1984

Patent document 10: Japanese Patent Laid-Open No. 10243/1985

Patent document 11: Japanese Patent Laid-Open No. 10244/1985

Patent document 12: Japanese Patent Laid-Open No. 247637/1985

Patent document 13: Japanese Patent Laid-Open No. 229005/1989

Patent document 14: Japanese Patent Laid-Open No. 319080/1997

DISCLOSURE OF INVENTION

Problems to be Solved by the Invention

An object of the present invention is to provide a photosensitive resin composition, which is of a one-component type, has long-term storage stability, and can improve the solvent resistance and water resistance of a relief pattern, and a photosensitive film and a stencil for screen printing using the composition.

Means for Solving the Problems

The present inventors have made extensive and intensive studies with a view to solving the above problems of the prior art, which has led to the completion of the present invention. Thus, according to the present invention, there are provided a photosensitive resin composition, which is of a one-component type having excellent long-term storage stability and can be developed with neutral water, a photosensitive film, and a stencil for screen printing.

The photosensitive resin composition according to the present invention is characterized by comprising components (A), (B), and (C):

component (A): a poly(vinyl alcohol) polymer represented by general formula (1) or (2)

[Chemical formula 1]

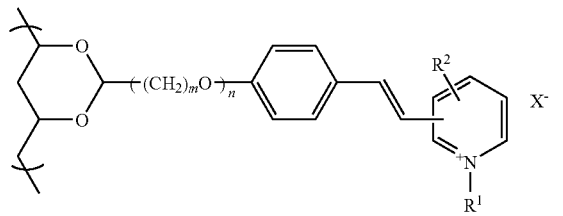

formula (1)

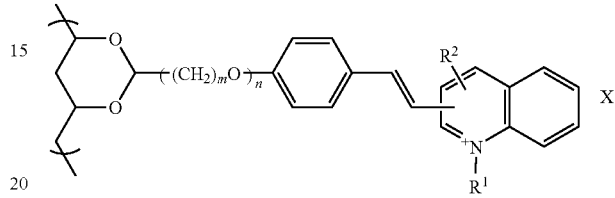

formula (2)

wherein $R^1$ represents a hydrogen atom, an alkyl or aralkyl group having 1 to 10 carbon atoms, wherein the alkyl and aralkyl groups may be substituted by a hydroxyl or carbamoyl group and the bond between carbon atoms thereof may be present through an oxygen atom or an unsaturated bond; $R^2$ represents a hydrogen atom or an alkyl group having 1 to 3 carbon atoms; m is an integer of 1 to 6; n is 0 or 1; and $X^-$ represents a halogen ion, a phosphate ion, a methosulfate ion, or a sulfonate ion, or a mixture of the anions;

component (B): a radical polymerizable monomer containing at least one ethylenically unsaturated bond and possesses an anion dissociating capability; and component (C): a radical photoinitiator.

In a preferred embodiment of the present invention, component (A) in the photosensitive resin composition contains a cationic group other than the quaternized heterocyclic aromatic ring cation group.

In a preferred embodiment of the present invention, the photosensitive resin composition further comprises an aqueous resin emulsion (component (D)).

In a preferred embodiment of the present invention, the photosensitive resin composition further comprises a diazo resin (component (E)).

In a preferred embodiment of the present invention, the photosensitive resin composition further comprises an inorganic or organic powder (component (F)).

The photosensitive film according to the present invention is characterized by comprising the above photosensitive resin composition.

The stencil for screen printing according to the present invention is characterized by comprising the above photosensitive resin composition.

Further, the stencil for screen printing according to the present invention is characterized by comprising the above photosensitive film.

EFFECT OF THE INVENTION

The photosensitive resin composition, the photosensitive film produced from the composition, and the stencil for screen printing using the photosensitive film according to the present invention have the above respective constructions. Further, since the solvent used is water, the problem of the environmental contamination can be advantageously avoided and the following effects can be attained.

(1) Only water is used as a solvent for the preparation and development of an actinic radiation-sensitive resin composition. This is advantageous from the viewpoints of safety of working environments, fire prevention, and pollution prevention.

(2) By virtue of one-component type, the workability is excellent.

(3) A variety of sensitizing agents can be used in combination, and, thus, a composition, which is sensitive to a wide wavelength range, that is, wavelengths ranging from far-ultraviolet light to near-infrared light, can be provided.

(4) The composition is coated onto a film or a screen base material to form an actinic radiation-sensitive resin film for use as a photosensitive film which can be stored for a long period of time.

(5) The composition may be coated onto a film to form a dry film.

BEST MODE FOR CARRYING OUT THE INVENTION

Component (A)

Component (A) in the present invention is a poly(vinyl alcohol) polymer represented by general formula (1) or (2).

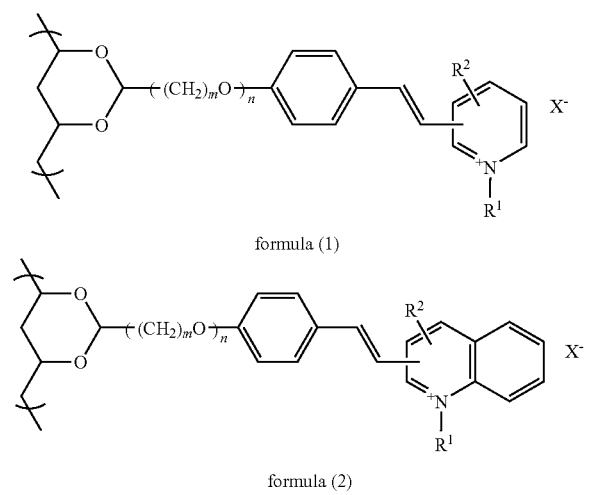

[Chemical formula 2]

formula (1)

formula (2)

In the formulae, $R^1$ represents a hydrogen atom, an alkyl or aralkyl group, wherein the alkyl and aralkyl groups may be substituted by a hydroxyl or carbamoyl group and the bond between carbon atoms thereof may be present through an oxygen atom or an unsaturated bond; $R^2$ represents a hydrogen atom or an alkyl group having 1 to 3 carbon atoms; m is an integer of 1 to 6; n is 0 or 1; and $X^-$ represents a halogen ion, a phosphate ion, a methosulfate ion, or a sulfonate ion, or a mixture of the anions.

The alkyl or aralkyl group represented by $R^1$ preferably has 1 to 10 carbon atoms, particularly preferably 1 to 7. Specific examples of residues include methyl, ethyl, propyl, butyl, pentyl, hexyl, 2-hydroxyethyl, 3-hydroxypropyl, 2-methoxyethyl, 3-methoxypropyl, allyl, crotyl, and benzyl. When m is above the upper limit of the range 1 to 6, the film which has been insolubilized by light irradiation is likely to be swollen. The m value is more preferably 1 to 4. n may be 0 or 1.

Preferably, $X^-$ represents a phosphate ion; a methosulfate ion; $Cl^-$ or $Br^-$ as a halogen ion; and $CH_3SO_3^-$, $CH_3CH_2SO_3^-$, $C_6H_5SO_3^-$, and p-$CH_3C_6H_4SO_3^-$ as a sulfonate ion.

The compounds represented by general formula (1) can be expressed as poly(vinyl alcohol) polymers containing a styryl-substituted pyridinium group, and the compounds represented by general formula (2) can be expressed as poly (vinyl alcohol) polymers containing a styryl-substituted quinolinium group.

The poly(vinyl alcohol) polymers represented by general formula (1) or general formula (2) can be preferably produced, for example, by reacting an aldehyde represented by general formula (3) or (4) with poly(vinyl alcohol) in an aqueous solution under acidic conditions.

[Chemical formula 3]

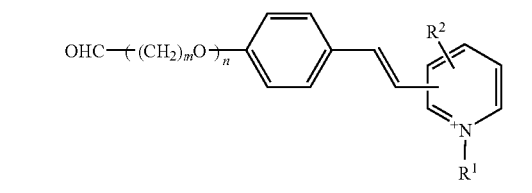

formula (3)

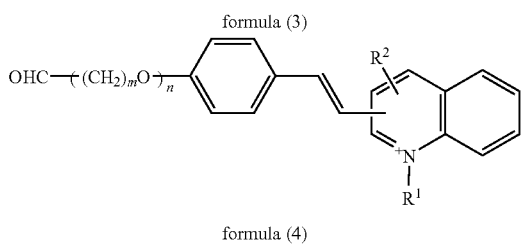

formula (4)

In formulae (3) and (4), $R^1$, $R^2$, m, n, and $X^-$ are as defined in formulae (1) and (2).

The poly(vinyl alcohol) used in this case is a vinyl acetate polymer having a degree of saponification of 60 to 100 mol %, more preferably 70 to 100 mol %. The poly(vinyl alcohol) may also be a copolymer with other vinyl monomer so far as water solubility is not sacrificed. When the degree of saponification is below the lower limit of the above-defined range, the water solubility is unsatisfactory. The average degree of polymerization is suitably 200 to 5000, preferably 300 to 4000. When the degree of polymerization is below the lower limit of the above-defined range, the speed of insolubilization by light irradiation is so low that the sensitivity is unsatisfactory. On the other hand, when the degree of polymerization is above the upper limit of the above-defined range, the viscosity of the composition is so high that the composition cannot be used. The amount of addition of the styrylpyridinium or styrylquinolinium group is generally 0.2 to 7.0 mol %, preferably 0.5 to 5.0 mol %, based on the vinyl alcohol unit in the poly(vinyl alcohol). When the amount of addition of the styrylpyridinium or styrylquinolinium group is below the lower limit of the above-defined range, the image information is likely to be unsatisfactory. On the other hand, when the amount of addition of the styrylpyridinium or styrylquinolinium group is above the upper limit of the above-defined range, the water solubility is likely to be deteriorated.

The poly(vinyl alcohol) polymer in the present invention represented by general formula (1) or (2) may be produced by any method, for example, by a method described in Japanese Patent Laid-Open No. 136265/1980 and Japanese Patent Laid-Open No. 8365/1981.

The photosensitive resin composition according to the present invention is characterized in that the ethylenic monomer having the capability to be dissociated into an anion can be ionically bonded to a cation site in a styrylpyridinium salt represented by general formula (1) or a quinolinium salt represented by general formula (2) to provide crosslinking by a photodimerization reaction and further to provide a crosslinked structure by radical polymerization. Accordingly, preferably, a cation site is introduced into the poly(vinyl alcohol) to be reacted with a photosensitive aldehyde derivative represented by general formula (3) or (4). An example of the poly(vinyl alcohol) suitable for this purpose is a poly (vinyl alcohol) into which a quaternary ammonium group has been introduced through an acetal bond, for example, using a 3-formylpyridinium salt, a 4-formylpyridinium salt, a 4-formylphenyltrimethylammonium salt, a formylmethyltrimethylammonium salt, or an acetal compound thereof by a method described, for example, in Japanese Patent Laid-Open No. 129742/1985. The amount of the cation group introduced is preferably 0.5 to 10 mol % based on the vinyl alcohol unit. Alternatively, for example, C-506 and CM-318 manufactured by Kuraray Co., Ltd. and K-210 manufactured by the Nippon Sythetic Chemical Industry Co., Ltd. may be used as the cationically modified poly(vinyl alcohol).

Component (B)

In the present invention, component (B) is a radical polymerizable monomer containing at least one ethylenically unsaturated bond and having the capability to be dissociated into an anion.

Sulfonic acid, carboxylic acid, and phosphoric acid may be mentioned as the residue having the capability to be dissociated into an anion in component (B). They can be used as an anion group-containing radical monomer by bringing them to an alkali salt thereof or an aliphatic amine ammonium salt thereof. Examples of radical polymerizable unsaturated groups in monomers used to this end include acryloyl, methacryloyl, maleic acid monoester, styryl, and allyl groups. Examples of acid-type monomers, which are not in a dissociated state, include, but are not limited to, acrylic acid, methacrylic acid, maleic acid monomethyl ester, maleic acid monoethyl ester, phthalic acid 2-(meth)acryloyloxyethyl ester, phthalic acid 3-(meth)acryloyloxy-2-propyl ester, phthalic acid 3-(meth)acryloyloxy-2-propyl ester, cyclohexan-3-ene-1,2-dicarboxylic acid 2-(meth)acryloyloxyethyl ester, succinic acid 2-(meth)acryloyloxyethyl ester, cyclohexane-1,2-carboxylic acid 2-(meth)acryloyloxyethyl ester, maleic acid 2-(meth)acryloyloxyethyl ester, ω-carboxy-polycaprolactone monoacrylate, acrylic acid dimer; 2-(meth)acryloyloxyethyl phosphoric acid, 3-(meth)acryloyloxypropyl phosphoric acid, 2-(meth)acryloyloxy-3-propyl phosphoric acid, ω-(meth)acryloylpolyethylenoxyethylene phosphoric acid, ω-(meth)acryloylpolypropylenoxyethylene phosphoric acid, styrenesulfonic acid, N-(2-sulfoethyl)acrylamide, and N-(2-sulfoethyl)methacrylamide. Among them, particularly preferred are phthalic acid 2-(meth)acryloyloxyethyl ester, phthalic acid 3-(meth)acryloyloxy-2-propyl ester, phthalic acid 3-(meth)acryloyloxy-2-propyl ester, succinic acid 2-(meth)acryloyloxyethyl ester, cyclohexane-1,2-carboxylic acid 2-(meth)acryloyloxyethyl ester, maleic acid 2-(meth)acryloyloxyethyl ester, ω-carboxy-polycaprolactone monoacrylate, 2-(meth)acryloyloxyethyl phosphoric acid, 3-(meth)acryloyloxypropyl phosphoric acid, 2-(meth)acryloyloxy-3-propyl phosphoric acid, ω-(meth)acryloylpolyethylenoxyethylene phosphoric acid, and ω-(meth) acryloytpolypropylenoxyethylene phosphoric acid. The term "(meth)acryloyl" as used herein means both "acryloyl" and "methacryloyl."

The above component (B) may be used in an amount of 50 to 200 mol %, more preferably 80 to 150 mol %, based on the cationic site introduced into the poly(vinyl alcohol) including styryl-substituted pyridinium or quinolinium groups represented by general formula (1) or (2). When the amount of component (B) used is below the lower limit of the above-defined range, satisfactory water resistance and solvent resistance cannot be imparted to the coating film insolubilized by light irradiation. On the other hand, when the amount of component (B) used is above the upper limit of the above-defined range, the water resistance and solvent resistance improvement effect is saturated.

Component (C)

In the present invention, component (C) is a radical photoinitiator. Specific examples of preferred component (C) include water soluble ammonium group-containing thioxanthone derivatives and benzophenone derivatives. Oil-soluble radical photoinitiators include benzoin and benzoin alkyl ethers, for example, benzoin, benzoin methyl ether, benzoin ethyl ether, and benzoin isopropyl ether; acetophenones, for example, acetophenone, 2,2-dimethoxy-2-phenylacetophenone, 2,2-diethoxy-2-phenylacetophenone, 1,1-dichloroacetophenone, 2-hydroxy-2-methyl-1-phenylpropan-1-one, 1-(4-isopropylphenyl)-2-hydroxy-2-methylpropan-1-one, 1-(4-dodecylphenyl)-2-hydroxy-2-methylpropan-1-one, 4-(2-hydroxyethoxy)-phenyl(2-hydroxy-2-propyl) ketone, and 1-hydroxy cyclohexyl phenyl ketone; aminoacetophenones, for example, 2-methyl-1-[4-(methylthio)phenyl]-2-morpholinopropanone-1 and 2-benzyl-2-dimethylamino-1-(4-morpholinophenyl)-butanone-1; anthraquinones, for example, 2-methylanthraquinone, 2-ethylanthraquinone, 2-t-butylanthraquinone, and 1-chloroanthraquinone; thioxanthones, for example, 2,4-dimethylthioxanthone, 2,4-diethylthioxanthone, 2-chlorothioxanthone, and 2,4-diisopropylthioxanthone; ketals, for example, acetophenone dimethyl ketal and benzyl dimethyl ketal; benzophenones, for example, benzophenone; or xanthones. They may be used either solely or in a combination of two or more. Further, conventional photosensitizers such as tertiary amines may be used either solely or in a combination of two or more. They may be used in a solution or dispersion form.

An oil-soluble radical polymerizable monomer or oligomer may be dispersed as an aqueous emulsion in a composition comprising a photocrosslinkable poly(vinyl alcohol) containing a styryl-substituted pyridinium or quinolinium group represented by general formula (1) or (2), an anion radical polymerizable monomer, and a radical photoinitiator. This is convenient particularly because an oil-soluble photopolymerization initiator can be dissolved in a monomer or an oligomer followed by dispersion in water. Further, the photosensitive group-containing photocrosslinkable poly(vinyl alcohol) represented by general formula (1) or (2) per se functions as a dispersion stabilizer for the monomer. Monofunctional monomers usable herein include 2-ethylhexyl (meth)acrylate, isodecyl (meth)acrylate, 2-hydroxyethyl (meth)acrylate, 2-hydroxypropyl (meth)acrylate, 2-hydroxybutyl (meth)acrylate, 2-ethoxyethyl (meth)acrylate, 2-(2-ethoxyethoxy)ethyl (meth)acrylate, n-butoxyethyl (meth) acrylate, morpholinoethyl (meth)acrylate, benzyl (meth) acrylate, phenyl (meth)acrylate, methoxydiethylene glycol (meth)acrylate, methoxytriethy(propy)lene glycol (meth) acrylate, methoxytetraethy(propy)lene glycol (meth)acrylate, methoxypolyethy(propy)lene glycol (meth)acrylate, ethoxydiethy(propy)lene glycol (meth)acrylate, ethoxytriethy(propy)lene glycol (meth)acrylate, cyclohexyl (meth)acrylate, tetrahydrofuryl (meth)acrylate, isobornyl (meth)acrylate, dicyclopentanyl (meth)acrylate, N,N-dimethylaminoethyl (meth)acrylate, and N,N-diethylaminoethyl (meth)acrylate. The term "(meth) acrylate" as used herein means both "acryl" and "methacryl." The term "ethy(propy)lene" as used herein means both "ethylene" and "propylene."

Polyfunctional monomers include ethyleneglycol di(meth) acrylate, diethyleneglycol di(meth)acrylate, 1,3-trimethyleneglycol di(meth)acrylate, 1,4-butanediol di(meth)acrylate, 1,6-hexanediol di(meth)acrylate, neopentyl glycol di(meth) acrylate, bis(acryloxyneopentyl glycol)adipate, bis(methacryloxyneopentyl glycol)adipate, epichlorohydrin-modified 1,6-hexanediol di(meth)acrylate hydroxypivalic acid neopentylglycol di(meth)acrylate, caprolactone-modified hydroxypivalic acid neopentylglycol di(meth)acrylate polyethyleneglycol di(meth)acrylate, propyleneglycol di(meth) acrylate, dipropyleneglycol di(meth)acrylate, tripropyleneglycol di(meth)acrylate, tetrapropyleneglycol di(meth) acrylate, polypropyleneglycol di(meth)acrylate, trimethylolpropane tri(meth)acrylate, ditrimethylolpropane tri(meth)acrylate, neopentyl glycol-modified trimethylolpropane di(meth)acrylate, ethyleneoxide-modified trimethylolpropane tri(meth)acrylate, propyleneoxide-modified trimethylolpropane tri(meth)acrylate, pentaerythritol tetra(meth) acrylate, stearic acid-modified pentaerythritol di(meth) acrylate, dipentaerythritol hexa(meth)acrylate, dipentaerythritol monohydroxy penta(meth)acrylate, alkyl-modified dipentaerythritol poly(meth)acrylate, caprolactone-modified dipentaertythritol poly(meth)acrylate, glycerin di(meth)acrylate, epichlorohydrin-modified glycerol tri (meth)acrylate, tris(acryloxyethyl) isocyanurate, tris(methacryloxyethyl) isocyanurate, caprolactone-modified tris (acryloxyethyl) isocyanurate, and caprolactone-modified tris (methacryloxyethyl) isocyanurate.

Oligomers usable herein include polyester (meth)acrylate oligomers, bisphenol A epoxy (meth)acrylates, caprolactone-added (meth)acrylates, phenol novolak epoxy (meth)acrylates, cresol novolak epoxy (meth)acrylates, and other epoxy (meth)acrylates and urethane (meth)acrylates. Specific examples of preferred oligomers are described, for example, in "Hikari Koka Gijutsu Deta Bukku (Photocuring Technology Data Book) (2000)," pp. 84-119, published by TECHNONET.

Further, ethylenically unsaturated group-containing polyester dendrimers and the like can be used. Specific examples of such ethylenically unsaturated group-containing polyester dendrimers are described, for example, in Japanese Patent Laid-Open No. 76005/2005, Japanese Patent Laid-Open No. 47979/2005, and Japanese Patent Laid-Open No. 76005/2005.

The photosensitive resin composition according to the present invention is superior in solvent resistance and further water resistance to the case where a photosensitive group-containing photocrosslinkable poly(vinyl alcohol) represented by general formula (1) or (2) is used solely. The reason for this is believed to reside in that a crosslinked structure of a poly(vinyl alcohol) chain is formed by a photodimerization reaction of this type of photosensitive group and, further, a monomer having an anion dissociation capability is polymerized by a radical photopolymerization reaction, and, at the same time, a crosslinked structure is further formed at the cationic site in the poly(vinyl alcohol) chain through ionic mutual action.

The amount of component (C) incorporated is preferably 0.01 to 0.5, particularly preferably 0.02 to 0.1, based on one part by weight of component (B). In this connection, it should be noted that, when an oil-soluble radical polymerizable monomer or oligomer is further added, the amount of component (C) incorporated is the amount of component (B) based on one part by weight in total of the radical polymerizable monomer or oligomer and component (B).

Component (D)

If necessary, an aqueous resin emulsion may be further incorporated in the photosensitive resin composition according to the present invention. In the present invention, preferred aqueous resin emulsions include, for example, poly (vinyl acetates), vinyl acetate/ethylene copolymers, vinyl acetate/acrylic ester copolymers (wherein acrylic esters include methyl acrylate and 2-ethylhexyl acrylate), (meth) acrylic acid polymers, styrene/butadiene copolymers, methyl methacrylate/butadiene copolymers, acrylonitrile/butadiene copolymers, chloroprene polymers, isoprene polymers, poly (vinyl chlorides), poly(vinylidene chlorides), polystyrenes, silicone resins, polyethylenes, polyurethanes, and fluororesins. Hydrophobic polymer particles thereof include emulsions produced in a polymerization process, for example, polyvinyl acetate emulsions, ethylene/vinyl acetate copolymer emulsions, vinyl acetate/acryl copolymer emulsions, ethylene/vinyl acetate/acryl terpolymer emulsions, vinyl chloride/vinyl acetate copolymer emulsions, acryl emulsions, styrene/butadiene latex emulsions, MBR latex emulsions, acrylonitrile/butadiene rubber latex emulsions, chloroprene rubber latex emulsions, and vinylidene chloride emulsions. For example, polyethylene dispersions, polyolefin ionomer dispersions, and urethane ionomer dispersions are useful as synthetic polymer dispersions. Dispersions of synthetic polymer fine powders and purified starches may also be used.

The amount of component (D) incorporated is preferably 0.05 to 10 parts by weight, particularly preferably 0.2 to 5 parts by weight, based on one part by weight of the aqueous solution containing component (A).

Component (E)

If necessary, a diazo resin may be incorporated in the photosensitive resin composition according to the present invention. Diazo resins usable herein include, for example, water soluble diazo resins produced by condensing a diazotized product of a diphenylamine compound, such as
4-amino-4"-methyldiphenylamine,
4-amino-4'-ethyldiphenylamine,
4-amino-4'-methoxydiphenylamine,
4-amino-4'-chlordiphenylamine, or
4-amino-4"-nitrodiphenylamine, in addition to p-aminodiphenylamine using an aldehyde compound such as paraformaldehyde, acetaldehyde, propionaldehyde, or n-butyraldehyde.

The amount of component (E) incorporated is preferably 0.001 to 0.10 part by weight, particularly preferably 0.002 to 0.05 part by weight, based on one part by weight of an aqueous solution containing component (A).

Component (F)

Further, if necessary, an inorganic or organic powder may be incorporated in the photosensitive resin composition according to the present invention. Examples thereof include metals such as aluminum, zinc, copper, bronze, and lead, and aluminum oxide. Specific examples of preferred component (F) include metal oxides such as alumina, beryllium oxide, iron oxide, zinc oxide, zinc flower, magnesium oxide, zirconia, silicon oxide, and titanium oxide; silicates such as kaolin clay and pyrophyllite clay; glass; silicas such as diatomaceous earth, quartz powder, and quartz sand; and other materials, for example, carbon black, nepheline, cryolite (artificial cryolite), graphite, wollastonite, aluminum hydroxide, slate powder, zeolite, calcium carbonate, calcium magnesium, talc, potassium titanate, boron nitride, feldspar powder, molybdenum dioxide, barium sulfate, mica, and gypsum (anhydrous). In the present invention, among these inorganic solid materials, clay, talc, mica and the like are preferred.

The amount of component (F) incorporated is preferably 0.01 to 2 parts by weight, particularly preferably 0.05 to 1 part by weight, based on one part by weight of an aqueous solution containing component (A).

<Other Components (Optional Components)>

Organic pigments such as quinacridone pigments, azo pigments, diketopyrrolopyrrole pigments, perylene pigments, phthalocyanine pigments, and isoindoline pigments may be added to and dispersed in the photosensitive resin composition according to the present invention.

Further, if necessary, for example, surfactants, antifoaming agents, thermal polymerization inhibitors, oxidation inhibitors, adhesion imparting agents, plasticizers, solvents, surface tension regulating agents, stabilizers, chain transfer inhibitors, flame retardants, antimicrobial agents, and preservatives may be added to the photosensitive resin composition according to the present invention.

<Photosensitive Resin Composition and Photosensitive Film>

The photosensitive film according to the present invention comprises the above photosensitive resin composition. The photosensitive film according to the present invention may consist of the photosensitive resin composition only, or alternatively may comprise the photosensitive resin composition and resin materials or materials other than the photosensitive resin composition.

The photosensitive resin composition according to the present invention is suitable for forming a coating film (a resin film) on all of base materials, for example, woods, fabrics, papers, ceramics, glasses, polyesters, polyolefins, cellulose acetate, polyimides, synthetic resins such as epoxy resins, glass fiber reinforced resins, metals such as aluminum, copper, nickel, iron, zinc, magnesium, and cobalt, semiconductor materials such as silicon and gallium arsenide germanium, and insulating materials such as silicon nitride and silicon oxide. When the base material is formed of particularly a synthetic resin, preferably, the base material is previously hydrophilized from the viewpoint of improving coating film forming properties. A pattern or a protective layer is formed by applying light to a coating film formed of the photosensitive resin composition according to the present invention formed on the base material.

The photosensitive resin composition is coated on the surface of the base material by a conventional method which can form an even coating film. Examples of such methods include bucket coating, rotary coating, brushing, spraying, reverse roll coating, dip coating, doctor knife coating, and curtain coating. The layer thickness varies depending upon the purpose and the type of the base material but is in the range of 0.1 to 1000 μm.

The photosensitive resin composition coated onto the base material is exposed after water evaporation. The photosensitive wavelength range is determined depending upon the type of the photocation polymerization initiator and the sensitizer. In particular, since a wide range of sensitizers can be used, light wavelengths range widely from far-ultraviolet light to near-infrared light. Light sources usable herein include low-pressure mercury lamps, high-pressure mercury lamps, ultra-high-pressure mercury lamps, xenon lamps, mercury-xenon lamps, halogen lamps, and fluorescent lamps. Other suitable light sources usable herein include various laser light sources which emit ultraviolet light, visible light, and near-infrared light. The exposure may be carried out through a photomask, or alternatively may be carried out by direct writing with a laser beam on the photosensitive film. The exposed film is then developed with neutral water. The development is carried out by immersing the photosensitive film in water to dissolve and remove the unexposed parts and further removing the unexposed parts by a water stream through a spray gun.

<Stencil for Screen Printing>

The stencil for screen printing according to the present invention comprises the photosensitive resin composition. The stencil for screen printing may be produced by coating the photosensitive resin composition on a screen according to a conventional method, drying the coating, then exposing the coating, and developing the exposed coating by immersing the coating in water to dissolve and remove unexposed parts or by applying a water stream through a spray gun to the coating to remove unexposed areas. Alternatively, the stencil for screen printing may be produced by a conventional process, that is, by coating the photosensitive resin composition on a plastic film, drying the coating to prepare a sensitized film for screen plate making, applying the film on the surface of a screen plate with the aid of water or the like, drying the assembly, removing the plastic film, then conducting exposure and, if necessary, heating treatment and then conducting development.

A self-supporting film comprising the photosensitive resin composition according to the present invention coated on a plastic film may be used as a dry film based on the lamination of the self-supporting film on a substrate. In this case, a method may be adopted which comprises exposing the film provided on the substrate, optionally heat treating the assembly, developing the assembly, and subjecting the assembly to chemical etching or sandblasting.

EXAMPLES

Preparation of Photosensitive Resin Compositions

Example 1

A poly(vinyl alcohol) having an average degree of polymerization of 1800 and a degree of saponification of 88% (40 g) was dissolved in 500 mL of water. 1-Methyl-4-(formylphenyl)pyridinium methosulfate (3.65 g) and 5 g of 850% phosphoric acid were added to the solution, and the mixture was stirred for 12 hr. This reaction solution was rendered neutral with an ion exchange resin and was then mixed with 5 g of a monoethanolamine salt of methacryloyloxyethyl phosphoric acid. A solution of 2.5 g of 2-methyl-1[4-(methylthio)phenyl]-2-morpholinopropan-1-one as a radical photoinitiator dissolved in 80 g of pentaerythritol triacrylate was added to the solution with stirring to prepare a photosensitive resin composition.

Example 2

3-Pyridinealdehyde (10 g) was dissolved in 50 mL of ethyl acetate. Dimethylsulfuric acid (11.8 g) was added dropwise to the solution, and the mixture was allowed to stand at room temperature overnight to give 19 g of crude 1-methyl-3-formylpyridinium methosulfate as a brown oil. A poly(vinyl alcohol) having an average degree of polymerization of 1800 and a degree of saponification of 88% (40 g) was dissolved in 500 mL of water. 1-Methyl-3-formylpyridinium methosulfate (10.6 g) and 5 g of 85% phosphoric acid were added to the solution, and the mixture was stirred at 80° C. for 24 hr. The temperature of the reaction solution was returned to room temperature before 3.65 g of 1-methyl-4-formylpyridinium methosulfate was added to the reaction solution followed by stirring for 12 hr. This reaction solution was rendered neutral with an ion exchange resin. The aqueous solution was then mixed with 5 g of a monoethanolamine salt of methacryloyloxyethyl phosphoric acid. A solution of 2.5 g of 2-methyl-1 [4-(methylthio)phenyl]-2-morpholinopropan-1-one as a radical photoinitiator dissolved in 80 g of pentaerythritol triacrylate was added to the solution with stirring to prepare a photosensitive resin composition.

Example 3

A cation modified poly(vinyl alcohol) CM-318 (degree of polymerization: 1800, degree of saponification: 88%, manufactured by Kuraray Co., Ltd.) (40 g) was dissolved in 500 g of water. The solution was adjusted to pH 1.5 to 2.0 by the addition of phosphoric acid. 1-Methyl-4-(formylphenyl)pyridinium methosulfate (3.65 g) was dissolved in the solution, and the mixture was stirred to give an aqueous photo-crosslinkable poly(vinyl alcohol) solution having an introduction ratio of 1.5 mol %. This aqueous solution (300 g) was then mixed with 5 g of a monoethanolamine salt of methacryloyloxyethyl phosphoric acid. A solution of 2.5 g of 2-methyl-1[4-(methylthio)phenyl]-2-morpholinopropan-1-one as a radical photoinitiator dissolved in 80 g of pentaerythritol triacrylate was added to the solution with stirring to prepare a photosensitive resin composition.

Example 4

GH-150 (nonvolatile component: 48%) manufactured by Saiden Chemical Industry Co., Ltd. (100 g) as component (D) and 20 g of L-1 manufactured by Nippon Talc Co., Ltd. as component (F) were added to the composition prepared in Example 3 followed by mixing to give a photosensitive resin composition.

Example 5

A diazo resin manufactured by Respe Chemical Co., Ltd. (1 g) was added as component (E) to the composition prepared in Example 4 followed by mixing to give a photosensitive resin composition.

Example 6

A photosensitive resin composition was produced in the same manner as in Example 3, except that 5 g of Light Ester HO-MS (2-methacryloyloxyethyl succinate) manufactured by Kyoeisha Chemical Co., Ltd. was added as component (B) instead of the monoethanolamine salt of methacryloyloxyethylphosphoric acid.

Example 7

A photosensitive resin composition was produced in the same manner as in Example 3, except that 2.5 g of the monoethanolamine salt of methacryloyloxyethylphosphoric acid and 2.5 g of Light Ester HO-MS (2-methacryloyloxyethyl succinate) manufactured by Kyoeisha Chemical Co., Ltd. as component (B) were added in combination.

Comparative Example 1

Poly(vinyl alcohol) having an average degree of polymerization of 1800 and a degree of saponification of 88% (40 g) was dissolved in 500 mL of water. 1-Methyl-4-(formylphenyl)pyridinium methosulfate (3.65 g) was added to the solution. The mixture was adjusted to pH 1.5 to 2.0 by the addition of phosphoric acid followed by mixing for 12 hr. This reaction solution was rendered neutral with an ion exchange resin. A solution of 2.5 g of 2-methyl-1[4-(methylthio)phenyl]-2-morpholinopropan-1-one as a radical photoinitiator dissolved in 80 g of pentaerythritol triacrylate was added to the solution with stirring to prepare a photosensitive resin composition.

Comparative Example 2

Ethyl phosphate (5 g) was added to and mixed with the composition prepared in Comparative Example 1 to give a photosensitive resin composition.

Comparative Example 3

A photosensitive resin composition was produced from a cation modified poly(vinyl alcohol) (manufactured by Kuraray Co., Ltd., CM-318 (degree of polymerization: 1800, degree of saponification: 88%)) in the same manner as in Example 3, except that the monoethanolamine salt of methacryloyloxyethyl phosphoric acid was not added.

Printing Plate Making

Examples 8 to 14

The following stencil for a screen was produced using the photosensitive resin compositions produced in Examples 1 to 7. The photosensitive resin composition was filtered through 250-mesh Tetron and was coated onto 250-mesh Tetron fixed to an aluminum frame with a stainless steel bucket, and the coating was then dried. The above procedure was repeated to form a 15 μm-thick photosensitive film. A positive-working film was brought into intimate contact with the photosensitive film followed by exposure from a distance of 1 m with a 3 kW metal halide lamp for 1 min. After immersion in water for 2 min, the assembly was developed by spraying with water to prepare a screen plate. For the resultant stencil, resolution and swelling with water (on a weight basis) (% by weight) were determined. The water resistance was evaluated by reciprocating a water-containing waste cloth on the plate 100 times to rub the stencil while applying a load of 1 kg to the stencil, measuring the film thickness and determining a film thickness reduction value in terms of μm. A printing durability test was also carried out by using a combination of the screen printing plate with a water-based ink (manufactured by MURAKAMI CO., LTD., Print Color Orange 21). The printing durability was evaluated as ○ when 2000 or more sheets of paper could be printed; was evaluated as Δ when not less than 1000 sheets and less than 2000 sheets of paper could be printed; and was evaluated as x when 500 or more sheets of paper could not be printed. The results are summarized in Table 1.

Comparative Examples 4 to 6

In the same manner as in Examples 8 to 14, stencils were produced using the photosensitive resin compositions of Comparative Examples 1 to 3, and the resolution, swelling in terms of weight by water, a film reduction, and durability were evaluated. The results are summarized in Table 1.

TABLE 1

Table 1: Evaluation of material for printing plate

| Evaluation of plate | Composition | Resolution (μm) | Film reduction (μm) | Water resistance/ swelling (wt. %) | Printing durability |
|---|---|---|---|---|---|
| Comp. Ex. 4 | Comp. Ex. 1 | 150 | 5 | 40 | x |
| Comp. Ex. 5 | Comp. Ex. 2 | 125 | 3 | 30 | Δ |
| Comp. Ex. 6 | Comp. Ex. 3 | 150 | 5 | 40 | x |
| Ex. 8 | Ex. 1 | 100 | 1 | 30 | Δ |
| Ex. 9 | Ex. 2 | 70 | 1 | 20 | ○ |
| Ex. 10 | Ex. 3 | 70 | 1 | 20 | ○ |
| Ex. 11 | Ex. 4 | 70 | 1 | 20 | ○ |
| Ex. 12 | Ex. 5 | 70 | 1 | 20 | ○ |
| Ex. 13 | Ex. 6 | 70 | 1 | 20 | ○ |
| Ex. 14 | Ex. 7 | 70 | 1 | 20 | ○ |

Photosensitive Film

Examples 15 to 20

The photosensitive resin compositions produced in Examples 2 to 7 were coated on a polyester film, and the coating was dried at 40° C. for 15 min to form a photosensitive film having a thickness of 25 to 30 μm. Light was applied to the film through a positive working film, which had been brought into intimate contact with the film, from a 4-kW ultrahigh-pressure mercury lamp or a 3-kW metal halide lamp from a place distant by 1 m from the film. Subsequently, water was sprayed on the film with a spray gun for development. As a result, it was found that, for all the films, a 70-μm pattern was faithfully resolved.

Example 21

The photosensitive resin composition produced in Example 3 was coated on a 250-mesh Tetron fixed on an aluminum frame, and the photosensitive film produced in Example 15 was applied onto the coating. The assembly was dried at 40° C. for 30 min. A positive working film was then brought into intimate contact with the assembly, and the assembly was exposed to light for 1 min from a 3-kW metal halide lamp located distant by 1 m from the assembly The assembly was immersed in water for 2 min followed by spray development with water to produce a screen plate. The resolution of the stencil was 70 μm, and the swelling by water in term of weight was 20%. A printing durability test was carried out using a water-based ink. As a result, it was found that, even after printing on 3000 sheets of paper, no dropout of the photosensitive film was observed and, thus, the screen plate had excellent water resistance and printing durability.

Examples 22 to 26

The same test as in Example 21 was carried out for the films produced in Examples 16 to 20. As a result, the same results as in Example 21 could be obtained.

The invention claimed is:

1. A photosensitive resin composition comprising components (A), (B), and (C):
   component (A): a poly(vinyl alcohol) polymer represented by formula (1) or (2)

[Chemical formula]

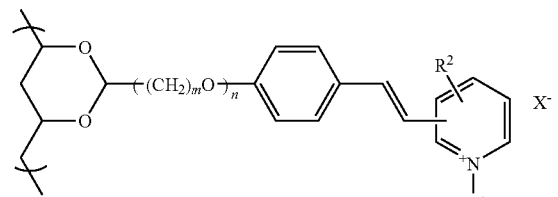

formula (1)

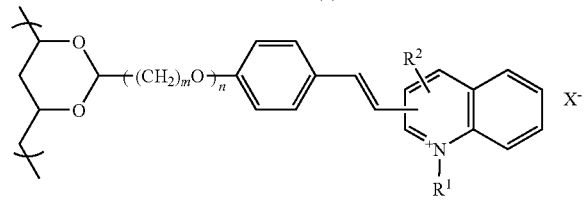

formula (2)

wherein $R^1$ represents a hydrogen atom, an alkyl or aralkyl group having 1 to 10 carbon atoms, wherein the alkyl and aralkyl groups may be substituted by a hydroxyl or carbamoyl group and the bond between carbon atoms thereof may be present through an oxygen atom or an unsaturated bond; $R^2$ represents a hydrogen atom or an alkyl group having 1 to 3 carbon atoms; m is an integer of 1 to 6; n is 0 or 1; and $X^-$ represents a halogen ion, a phosphate ion, a methosulfate ion, or a sulfonate ion, or a mixture of the anions;

component (B): a radical polymerizable monomer containing at least one ethylenically unsaturated bond and possesses an anion dissociating capability; and component (C): a radical photoinitiator.

2. The photosensitive resin composition according to claim 1, wherein the component (A) contains a cationic group other than the quaternized heterocyclic aromatic ring cation group.

3. The photosensitive resin composition according to claim 2, further comprising component (D):
   component (D): a water-based resin emulsion.

4. The photosensitive resin composition according to claim 2, further comprising component (E):
   component (E): a diazo resin.

5. The photosensitive resin composition according to claim 2, further comprising component (F):
   component (F): an inorganic or organic powder.

6. The photosensitive resin composition according to claim 1, further comprising component (D):
   component (D): a water-based resin emulsion.

7. The photosensitive resin composition according to claim 6, further comprising component (E):

component (E): a diazo resin.

8. The photosensitive resin composition according to claim 6, further comprising component (F):

component (F): an inorganic or organic powder.

9. The photosensitive resin composition according to claim 1, further comprising component (E):

component (E): a diazo resin.

10. The photosensitive resin composition according to claim 9, further comprising component (F):

component (F): an inorganic or organic powder.

11. The photosensitive resin composition according to claim 10, further comprising component (D):

component (D): a water-based resin emulsion.

12. The photosensitive resin composition according to claim 1, further comprising component (F):

component (F): an inorganic or organic powder.

13. A photosensitive film comprising a photosensitive resin composition according to claim 1.

14. A stencil for screen printing, comprising a photosensitive film according to claim 13.

15. A stencil for screen printing, comprising a photosensitive resin composition according to claim 1.

* * * * *